United States Patent
Cha et al.

(10) Patent No.: US 7,515,477 B2
(45) Date of Patent: Apr. 7, 2009

(54) NON-VOLATILE MEMORY DEVICE AND METHOD OF PROGRAMMING THE SAME

(75) Inventors: Jae Won Cha, Icheon-si (KR); Sam Kyu Won, Icheon-si (KR); Kwang Ho Baek, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 11/751,586

(22) Filed: May 21, 2007

(65) Prior Publication Data

US 2008/0159006 A1 Jul. 3, 2008

(30) Foreign Application Priority Data

Dec. 28, 2006 (KR) .................. 10-2006-0136352

(51) Int. Cl.
*G11C 16/06* (2006.01)
(52) U.S. Cl. .................. 365/185.25; 365/185.17; 365/185.18
(58) Field of Classification Search ............ 365/185.17, 365/185.18, 185.11, 185.12, 189.05, 230.06
See application file for complete search history.

(56) References Cited

U.S. PATENT DOCUMENTS

| | | | |
|---|---|---|---|
| 6,072,719 A * | 6/2000 | Tanzawa et al. | 365/185.03 |
| 6,154,403 A * | 11/2000 | Tanzawa et al. | 365/203 |
| 7,269,064 B2 * | 9/2007 | Kim | 365/185.12 |
| 7,366,014 B2 * | 4/2008 | Micheloni et al. | 365/185.03 |

FOREIGN PATENT DOCUMENTS

| | | | |
|---|---|---|---|
| KR | 1020050073845 A | | 7/2005 |
| KR | 1020050096445 A | | 10/2005 |
| KR | 1020050106222 A | | 11/2005 |
| KR | 1020050112988 A | | 12/2005 |
| KR | 1020050112991 A | | 12/2005 |
| KR | 2007000009 A | * | 1/2007 |
| KR | 2007010305 A | * | 1/2007 |
| KR | 2007023174 A | * | 2/2007 |

* cited by examiner

*Primary Examiner*—Gene N. Auduong
(74) *Attorney, Agent, or Firm*—Townsend and Townsend and Crew LLP

(57) ABSTRACT

A non-volatile memory device comprises an even bit line and an odd bit line contacting to a memory cell array. A register unit includes a first register and a second register for temporarily storing data. A detecting node detects a voltage level of the specific bit line or the specific register which is connected to the bit lines and the registers. A selecting unit of the bit line includes a first variable voltage input terminal and a second variable voltage input terminal. The first variable voltage input terminal applies a first variable voltage of a specific voltage level to the even bit line in response to an even discharge signal. The second variable voltage input terminal applies a second variable voltage of a specific voltage level to the odd bit line in response to an odd discharge signal.

14 Claims, 3 Drawing Sheets

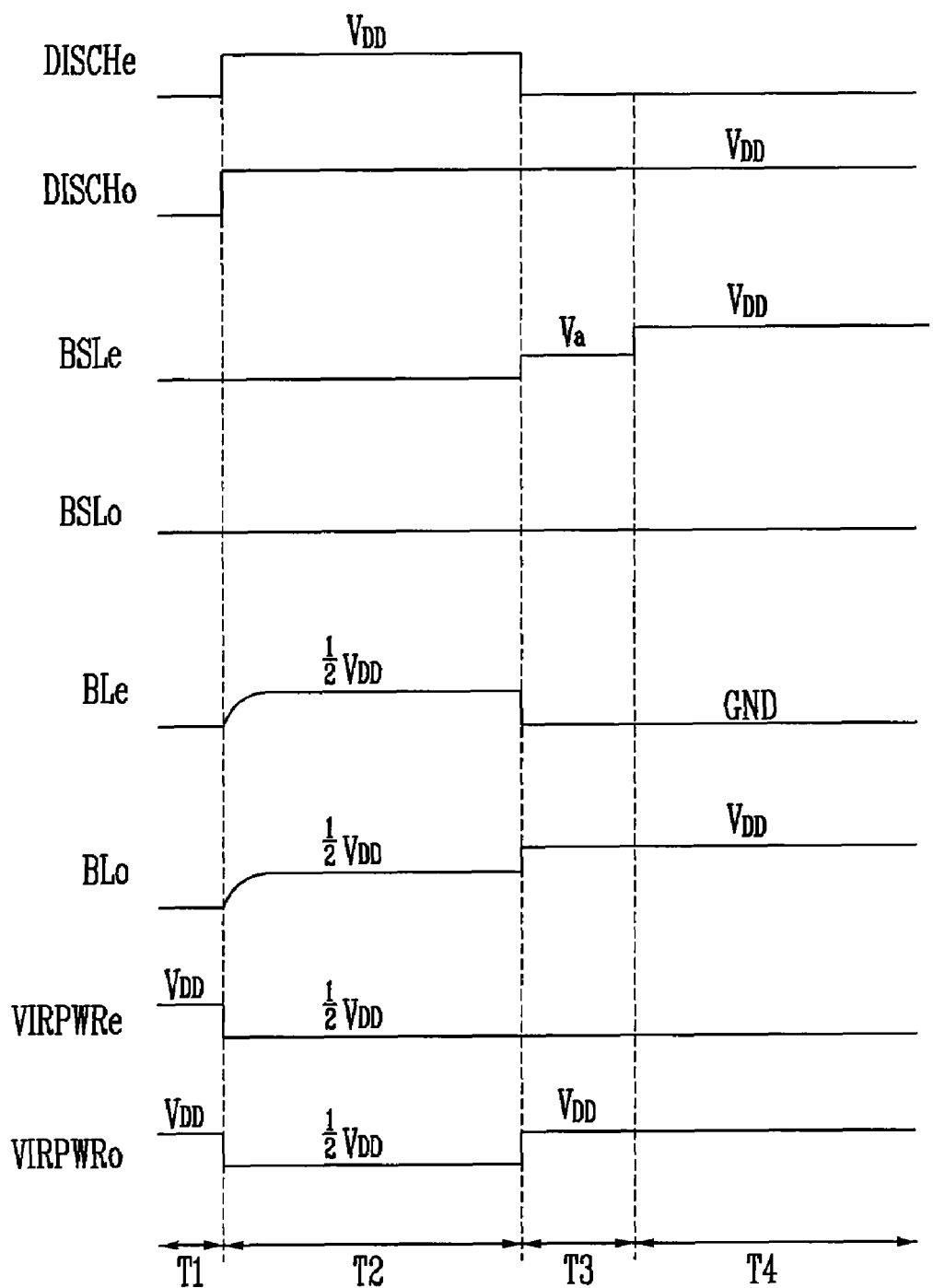

NON-VOLATILE MEMORY DEVICE AND METHOD OF PROGRAMMING THE SAME

CROSS-REFERENCES TO RELATED APPLICATIONS

The present application claims priority to Korean patent application number 10-2006-136352, filed on Dec. 28, 2006, which is incorporated by reference in its entirety.

BACKGROUND OF THE INVENTION

The present invention relates to a non-volatile memory device and a method of programming the same, and more particularly, to a non-volatile memory device including a selecting unit of a bit line having a structure that prevents each applied voltage from decreasing when the program executes.

Demand has increased for a non-volatile device which may be electrically programmed and erased, and does not require a periodic refresh function for rewriting data.

A non-volatile memory device includes a memory cell array and a page buffer. The memory cell array is assigned with cells of in matrix arrangement where data is stored. The page buffer writes memory to specific cells of the memory cell array or reads the memory stored in the specific cells. The page buffer includes a pair of bit lines connected to a specific memory, a register, a detecting node which detects a voltage level of a specific bit line or a specific register, and a selecting unit of the bit line which controls whether to connect to the specific bit line and the detecting node. The register temporarily stores data to record in the memory cell array or temporarily stores data of the specific cell which is read from the memory cell array.

A voltage is applied to the selecting unit of the bit line to simultaneously apply a variable voltage to each bit line. However, the voltage irregularly decreases while executing the program.

SUMMARY OF THE INVENTION

A non-volatile memory device comprises an even bit line, an odd bit line, a register unit, a detecting node, and a selecting unit. The even bit line and the odd bit line are coupled to a memory cell array. The register unit includes a first register and a second register which temporarily store specific data. The detecting node detects a voltage level of a specific bit line or a specific register connected to the bit lines. The selecting unit of the bit line includes a first variable voltage input terminal and a second variable voltage input terminal. The first variable voltage input terminal applies a first variable voltage of a specific voltage level to the even bit line in response to an even discharge signal. The second variable voltage input terminal applies a second variable voltage of a specific voltage level to the odd bit line in response to an odd discharge signal.

In another embodiment, a non-volatile memory device of comprises a first control input terminal, a second control terminal, and a plurality of NMOS transistors. The first control input terminal applies a first variable voltage of a specific voltage level to an even bit line. The second control input terminal applies a second variable voltage of a specific voltage level to an odd bit line. The plurality of NMOS transistors connect a specific bit line and each variable voltage input terminal in response to a discharge signal. The plurality of the NMOS transistors also connect a detecting node and the specific bit line in response to a selecting signal of the bit line.

In another embodiment, a programming method comprises applying a high level voltage as the first variable voltage and the second variable voltage . An even discharge signal of a predetermined level is applied so that half of the voltage level of the first variable voltage is applied to the even bit line. An odd discharge signal of a predetermined level is applied so that half of the voltage level of the second variable voltage is applied to the odd bit line. The variable voltage is removed from the bit line connected to the specific cell to be programmed. The selecting signal of the bit line having the high level is applied to the NMOS transistor of the bit line connected to the specific cell to be programmed so that the data stored in the register transfers to the bit line.

In another embodiment, a programming method includes applying an even discharge signal and an odd discharge signal with a high level voltage, and simultaneously applying half of the high level voltage as the first variable voltage and the second variable voltage so as to apply half of the high level voltage to the even discharge signal and the odd discharge signal. Half of the high level voltage is applied as the variable voltage to the bit line connected to the specific cell to be programmed. The high level voltage is applied as the variable voltage to the other bit line. The variable voltage is removed from the bit line connected to the specific cell to be programmed. A high level selecting signal of the bit line is applied to the NMOS transistor of the bit line connected to the specific cell to be programmed so that the data stored in the register transfers to the bit line.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3 illustrates the waveforms of the voltage signals applied to the page buffer when the program executes in the non-volatile memory device according to another embodiment of the present invention.

DESCRIPTION OF SPECIFIC THE INVENTION

Figure 1:
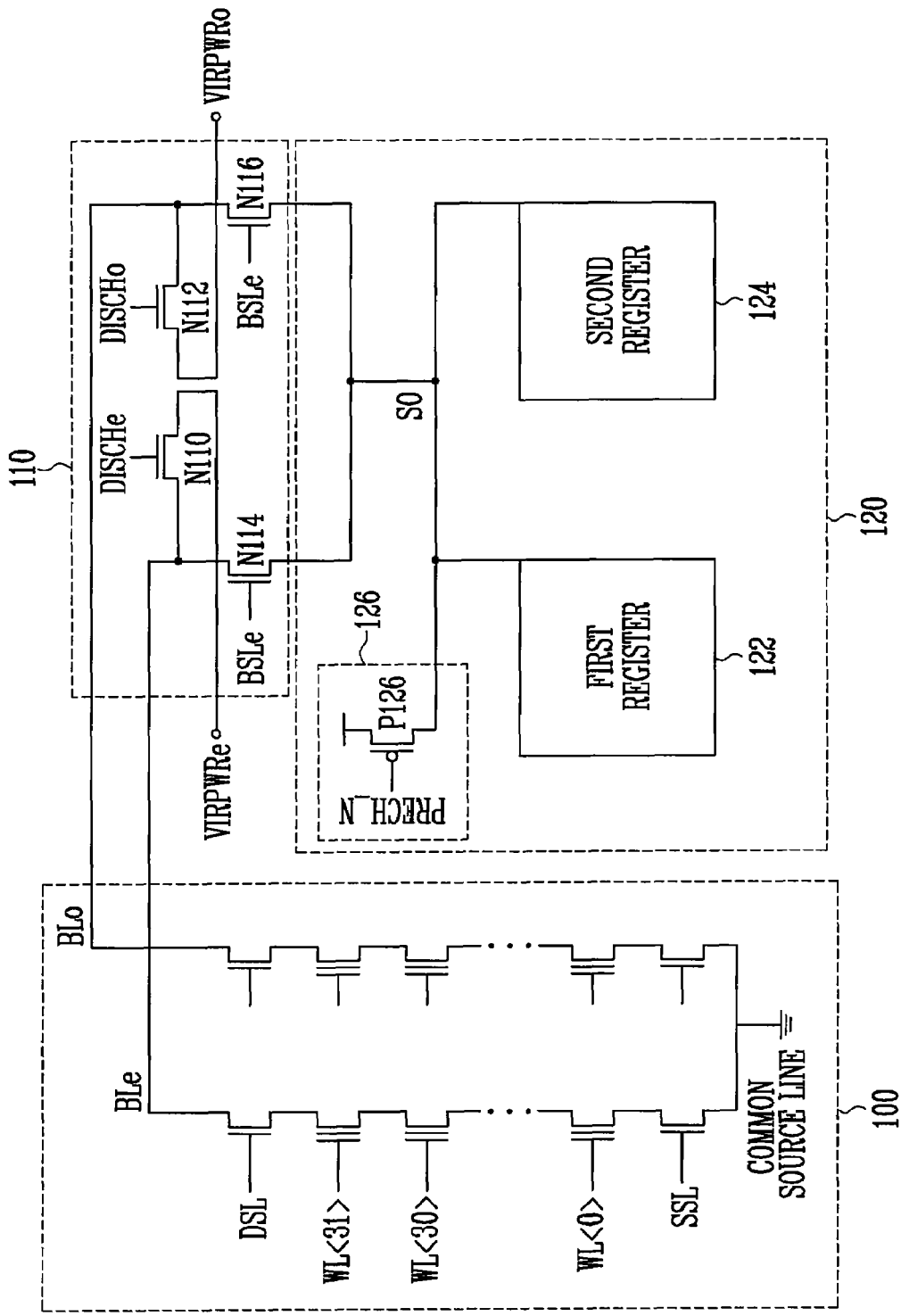
FIG. 1 is a circuit illustrating a structure of a non-volatile memory device according to an embodiment of the present invention.

Reference will now be made in detail to the preferred embodiments of the present invention, examples of which are illustrated in the accompanying drawings.

The non-volatile memory device comprises a page buffer including a memory cell array 100, a selecting unit 110 and a register unit 120. The memory cell array 100 is coupled to the selecting unit 110 by an even bit line BLe and an odd bit line BLo. The register unit 120 includes a first register 122 and a second register 124 where specific data is stored, a detecting node SO, and a pre-charge unit 126 for pre-charging the detecting node SO to a certain voltage level. The selecting unit 110 connects the specific bit line BLe or BLo to the detecting node SO. The detecting node SO connects the bit lines BLe and BLo to the registers 122 and 124 to detect a voltage level of specific bit lines and specific registers.

The memory cell array 100 includes memory cells for storing data, word lines for selecting and activating the memory cells, and bit lines BLe and BLo to input and output data of the memory cell. The memory cell array 100 has a structure in which a plurality of the word lines and a plurality of the bit lines are arranged in a matrix. The memory cell array 100 includes memory cells serially connected to a source select transistor SSL and a drain select transistor DSL (referred to as a string structure). A gate of the memory cells is connected to the word lines. A collection of the memory cells connected to the same word line is commonly referred to as a page. A plurality of strings connected to each bit line are connected in parallel to a common source line to comprise a block.

The selecting unit 110 of the bit line includes a first control input terminal and a second control input terminal. The first control input terminal applies a first variable voltage VIRPWRe of a specific voltage level to the even bit line BLe in response to an even discharge signal DISCHe. The second control input terminal applies a second variable voltage VIRPWRo of a specific voltage level to the odd bit line BLo in response to an odd discharge signal DISCHo.

The selecting unit 110 includes an NMOS transistor N110 and NMOS transistor N112. One terminal of the NMOS transistor N110 connects to the input terminal of the first variable voltage and responds to the even discharge signal DISCHe to supply the first variable voltage VIRPWRe to the even bit line BLe. One terminal of the NMOS transistor N112 connects to the input terminal of the second variable voltage and responds to the odd discharge signal DISCHo to supply the second variable voltage VIRPWRo to the odd bit line BLo. The selecting unit 110 also includes NMOS transistors N114 and N116. The NMOS transistors N114 and N116 connect the respective bit lines BLe and BLo to the detecting node SO in response to the selecting signal BSLe or BSLo of the bit line.

The pre-charge unit 126 includes a PMOS transistor P126 for connecting the detecting node SO to a power supply voltage in response to a pre-charge signal PRECH_N.

The first register 122 and the second register 124 temporarily store data according to the voltage level of the detecting node SO during a read operation of the data stored in a specific memory cell array. The first register and the second register 122 and 124 also temporarily store data that is input from an external source and is programmed in the specific memory cell. Each register includes a latch (not shown) and a transistor (not shown). The latch includes two inverters for temporarily storing data. The transistor connects to a node of each latch and activates in response to the voltage level of the detecting node SO.

Figure 2:
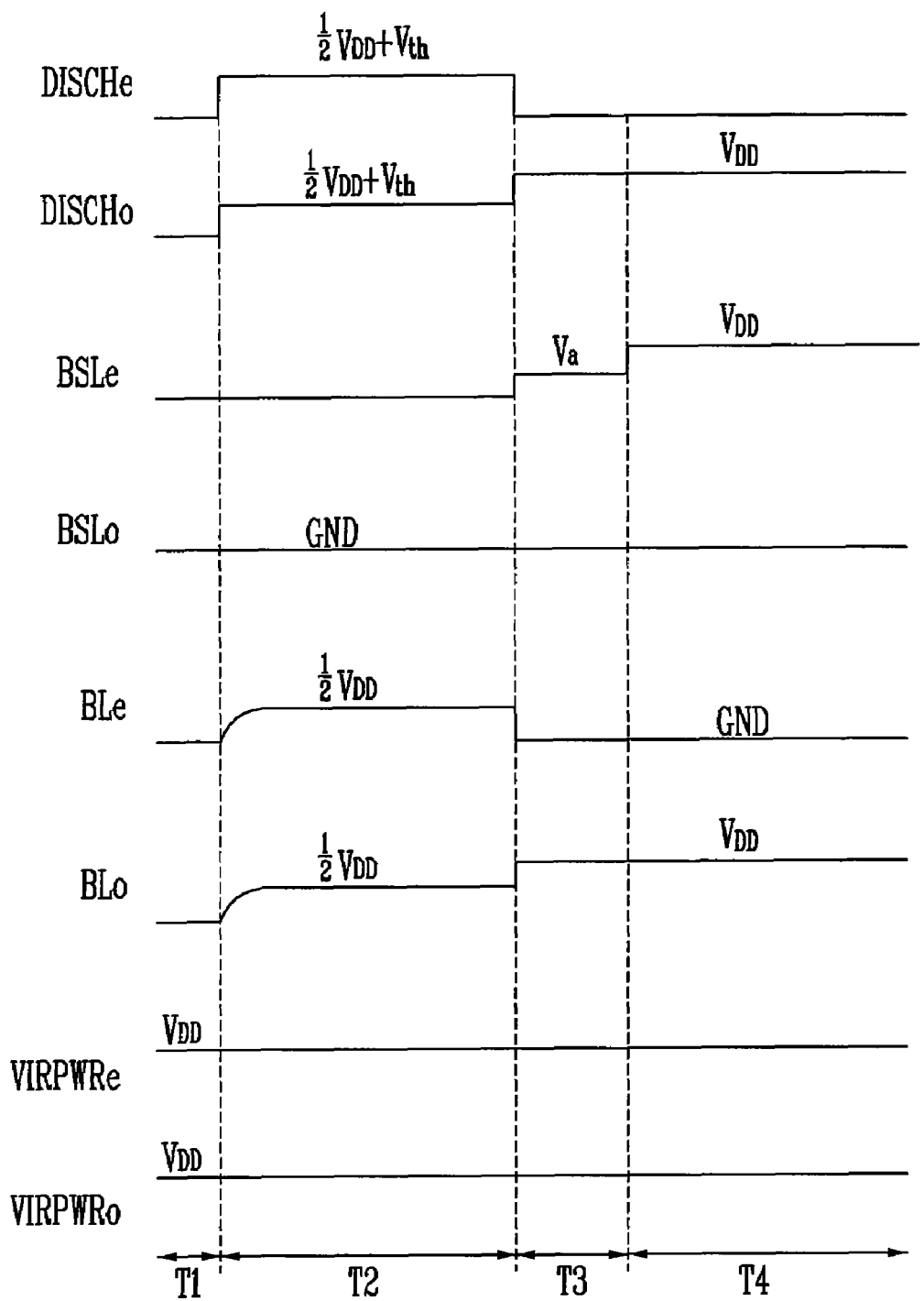
FIG. 2 illustrates waveforms of voltage signals applied to a page buffer when a program executes in the non-volatile memory device according to an embodiment of the present invention.

FIG. 2 shows waveforms of voltage signals applied to a page buffer when a program executes in the non-volatile memory device according to an embodiment of the present invention.

T1 Section

A first variable voltage VIRPWRe and a second variable voltage VIRPWRo of a high level voltage (VDD) are applied to first and second variable voltage input terminals, respectively. The input terminal of each variable voltage forms the even bit line and the odd bit line, respectively, so as to apply different signals. This prevents the voltage level of each variable voltage from temporarily dropping when applying a high level discharge signal.

T2 Section

The discharge signals DISCHe and DISCHo of a predetermined level are applied to the NMOS transistors N110 and N112 to apply the first variable voltage and the second variable voltage to each bit line. The voltage level of each discharge signal DISCHe and DISCHo is equal to ½VDD+Vth, where Vth is the threshold voltage of the corresponding NMOS transistor N110 and N112. Each bit line BLe and BLo pre-charges to as much as ½VDD of the variable voltage applied to each bit line. Therefore, the current supplied by the first variable voltage input and the second variable voltage input terminal is decreased to prevent the voltage level of each variable voltage from temporarily dropping. Also, because each bit line BLe and BLo is pre-charged to as much as ½VDD, the performance time in the T2 section is reduced so as to decrease the execution time of the program.

The high level voltage VDD is applied to a specific bit line BLe or BLo during the T2 section and is then changed to a low level voltage. The other bit line BLo or BLe continuously applies the high level voltage VDD. When changing the specific bit line BLe or BLo to the low level voltage, the voltage level of the other bit line BLo or BLe temporarily drops due to the coupling of the bit line. To reduce the amount by which the voltage drops, the voltage of each bit line is pre-charged to as much as ½VDD.

T3 Section

The specific bit line is connected to a specific cell of a pair of bit lines BLe and BLo to be programmed. In order to revent the specific bit line from pre-charging, a low level discharge signal is applied to the NMOS transistor N110 or N112 which is connected to the bit line. An attempt is made to program the specific cell connected to the even bit line first. Thus, the even low level discharge signal DISCHe is applied to the NMOS transistor N110 to deactivate the NMOS transistor N110. Therefore, the voltage level of the even bit line BLe is changed to the low level voltage.

A high level discharge signal is applied to the specific bit line which is not connected to the specific cell of the pair of bit lines BLe and BLo to be programmed. The discharge signal is a higher voltage than the voltage of the T2 section to stably pre-charge the specific bit line which is not connected to the specific cell to be programmed by the high level voltage VDD.

The high level discharge signal DISCHo is applied to the NMOS transistor N112 connected to the odd bit line BLo. The even bit line BLe is changed to the low level voltage and the odd bit line BLo is changed to the high level voltage. As described above, each bit line of the T2 section is pre-charged to a ½VDD level to prevent the voltage level of each bit line in the T3 section from sharply changing. Thus, the voltage level of the bit line is prevented from dropping due to the coupling of the bit line.

In order to couple the detecting node to the specific bit line which is connected to the specific cell of the pair of bit lines BLe and BLo to be programmed, a selecting signal BSLe or BSLo of the bit line at the high voltage level VDD is applied to the NMOS transistor N114 and N116. The selecting signal of the bit line having a certain voltage Va is applied to the transistor before applying the selecting signal BSLe or BSLo at the high level voltage VDD. The certain voltage Va is less than the high level voltage VDD and higher than a ground voltage GND.

The certain voltage Va is applied to the transistor to prevent the voltage from dropping due to the coupling of the bit line. A selecting signal BSLe of the even bit line having a certain voltage is applied in order to change the even bit line BLe to a low level voltage. By applying a signal of the certain voltage Va, a sharp change of the voltage is prevented in the changing process during which the specific bit line that is pre-charged to ½VDD is changed to the low level voltage. Thus, the voltage variation of the other bit line BLo due to the coupling of the bit line may be avoided.

T4 Section

In order to couple the detecting node SO to the specific bit line which is connected to the specific cell of the pair of bit lines BLe and BLo to be programmed, the selecting signal BSLe or BSLo at the high level voltage VDD is applied to the NMOS transistor N114 and N116 so as to transfer data stored in the register to the bit line. The voltage level of the specific bit line is changed according to the voltage level of the detecting node SO to determine whether the program executes. When the detecting node SO is at a low level voltage, the low level voltage is applied to the bit line and the specific cell is programmed. However, when the detecting node SO is at a high level voltage, the high level voltage is applied to the bit line and the specific cell is eliminated.

The selecting signal BSLe of the even bit line at the high level voltage VDD is applied to couple the detecting node SO and the even bit line BLe which is connected to the specific cell.

FIG. 3 illustrates waveforms of the voltage signals applied to the page buffer when the program executes in the non-volatile memory device according to another embodiment of the present invention.

T1 Section

A first variable voltage VIRPWRe and a second variable voltage VIRPWRo at the high level voltage VDD are applied to the first and the second variable voltage input terminals, respectively. The input terminal of each variable voltage includes the even bit line and the odd bit line that each apply different signals. This prevents the voltage level of each variable voltage from temporarily dropping when applying a high level discharge signal.

T2 Section

High level discharge signals DISCHe and DISCHo are applied to the NMOS transistors N110 and N112 to apply the first and the second variable voltages to each bit line.

The voltage ½VDD drops as much as a certain voltage in the high level voltage VDD when the first variable voltage VIRPWRe and the second variable voltage VIRPWRo are applied. Each bit line BLe and BLo is pre-charged to as much as a voltage level of ½VDD of the variable voltage that is applied to each bit line. The current supplied by the first variable voltage input terminal and the second variable voltage input terminal is decreased to prevent the voltage level of each variable voltage from temporarily dropping. Because each bit line BLe and BLo is pre-charged to as much as ½VDD, the performance time in the T2 section is reduced to decrease the execution time of the program.

The high level voltage VDD is applied to the specific bit line BLe or BLo in the T2 section and is then changed to the low level voltage. The other bit line BLo or BLe continuously applies the high level voltage VDD. At the point of changing the specific bit line BLe or BLo to the low level voltage, the voltage level of the other bit line BLo or BLe temporarily drops due to the coupling of the bit line. The voltage of each bit line is pre-charged to as much as ½VDD to reduce amount of voltage variation thereby preventing the voltage level of the other bit line BLo or BLe from temporarily dropping due to the coupling of the bit line.

T3 Section

In order to prevent a specific bit line from pre-charging due to the specific bit line being connected to a specific cell of a pair of bit lines BLe and BLo to be programmed, a low level discharge signal is applied to the NMOS transistor N110 or N112 which is connected to the bit line.

An attempt is made to program the specific cell connected to the even bit line first. A low level even discharge signal DISCHe is applied to the NMOS transistor N110 to deactivate the NMOS transistor N110. Therefore, the voltage level of the even bit line BLe is changed to the low level.

A high level discharge signal is applied to the specific bit line which is not connected to the specific cell of the pair of bit lines BLe and BLo to be programmed. The first variable voltage or the second variable voltage is changed to the high level in the specific bit line which is not connected to the specific cell of the pair of the bit lines BLe and BLo to be programmed. The discharge signal is at a higher voltage than that of the T2 section to stably pre-charge the specific bit line which is not connected to the specific cell to be programmed by the high level voltage VDD.

The high level discharge signal DISCHo is applied to the NMOS transistor N112 connected to the odd bit line BLo. The high level variable voltage VIRPWRo is applied to the second variable voltage input terminal which is connected to the odd bit line BLo.

The even bit line BLe is changed to the low level and the odd bit line BLo is changed to the high level. As described above, each bit line of in the T2 section is pre-charged to ½VDD to prevent the voltage level of each bit line in the T3 section from sharply changing. Thus, the voltage level of the bit line is prevented from dropping due to the coupling of the bit line.

In order to contact the detecting node SO to the specific bit line which is connected to the specific cell of the pair of bit lines BLe and BLo to be programmed, a selecting signal BSLe or BSLo of the bit line at the high level voltage VDD is applied to the NMOS transistor N114 and N116.

The selecting signal of the bit line having a certain voltage Va is applied to the transistor before applying the selecting signal BSLe or BSLo at the high level voltage VDD. The certain voltage Va is less than the high level voltage VDD and higher than the ground voltage GND.

The selecting signal is applied to prevent the voltage from dropping due to the coupling of the bit line. A selecting signal BSLe having a certain voltage is applied to the even bit line in order to change the even bit line BLe to the low level voltage. By applying a signal of the certain voltage Va, a sharp change of the voltage is prevented during the changing process. The specific bit line that is pre-charged to ½VDD changes to the low level voltage. Thus, the voltage variation of the other bit line BLo due to the coupling of the bit line may be prevented.

T4 Section

In order to couple the detecting node SO to the specific bit line which is connected to the specific cell of the pair of bit lines BLe and BLo to be programmed, the selecting signal BSLe or BSLo at the high level voltage VDD is applied to the NMOS transistor N114 and N116 to transfer data stored in the register to the bit line.

The voltage level of the specific bit line is changed according to the voltage level of the detecting node SO to determine whether the program executes. When the detecting node SO is at the low level voltage, the low level voltage is applied to the bit line and the specific cell is programmed. However, when the detecting node SO is at the high level voltage, the high level voltage is applied to the bit line and the specific cell is eliminated. The selecting signal BSLe of the even bit line at the high level voltage VDD is applied to couple the detecting node SO and the even bit line BLe which is connected to the specific cell.

According to the above described structure, the voltage of the signal is prevented from irregularly dropping when the program executes when signals are applied to the selecting unit of the bit line in the non-volatile memory device. Each bit line is pre-charged to the low level voltage so that the execution time of the programming is reduced. Each bit line is pre-charged to the low level voltage so that the coupling effect due to voltage variation of the specific bit line is prevented.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A non-volatile memory device comprising:
    an even bit line and an odd bit line for coupling to a memory cell array;
    a register unit comprising a first register and a second register for temporarily storing data;
    a detecting node for detecting a voltage level of a specific bit line or a specific register which is connected to the bit lines; and
    a selecting unit comprising a first variable voltage input terminal and a second variable voltage terminal, wherein the first variable voltage input terminal applies a first variable voltage to the even bit line in response to an even discharge signal, and the second variable voltage input terminal applies a second variable voltage to the odd bit line in response to an odd discharge signal,
    wherein the selecting unit pre-charges the even bit line and the odd bit line up to half of a first level voltage before coupling the detecting node to the bit line connected to a cell to be programmed,
    wherein the first level voltage is applied to the bit line disconnected from the cell to be programmed when the detecting node is coupled to the bit line connected to the cell to be programmed.

2. The device according to claim 1, wherein the selecting unit comprises:
    a first NMOS transistor which connects to the even bit line and the first variable voltage input terminal in response to the even discharge signal; and
    a second NMOS transistor which connects to the odd bit line and the second variable voltage input terminal in response to the odd discharge signal.

3. The device according to claim 1, wherein the selecting unit comprises a third NMOS transistor which connects to the detecting node and the even bit line in response to the first variable voltage; and a fourth NMOS transistor which connects to the detecting node and the odd bit line in response to the second variable voltage.

4. The device according to claim 1, wherein the selecting unit applies a high level voltage as the even discharge signal and the odd discharge signal for a certain time period, and simultaneously applies a voltage of up to half of the high level voltage for the first variable voltage and the second variable voltage.

5. The device according to claim 2, wherein the selecting unit applies a high level voltage as the first variable voltage and the second variable voltage for a certain period, and simultaneously applies a voltage of up to a sum of half the high level voltage and the threshold voltage of each NMOS transistor to which the discharge signal is applied, wherein half of the high level voltage is the even discharge signal and the odd discharge signal.

6. In a selecting unit of a non-volatile memory device comprising a first variable voltage input terminal applying a first variable voltage of a specific voltage level to an even bit line, a second variable voltage input terminal applying a second variable voltage of a specific voltage level to an odd bit line, a plurality of NMOS transistors connecting the specific bit line and each variable voltage input terminal in response to a discharge signal, and the plurality of the NMOS transistors connecting a detecting node and the specific bit line in response to a selecting signal of the bit line, a programming method comprising:
    applying a high level voltage as the first variable voltage and the second variable voltage;
    applying an even discharge signal of a predetermined level so that half of the voltage level of the first variable voltage is applied to the even bit line;
    applying an odd discharge signal of a predetermined level so that half of the voltage level of the second variable voltage is applied to the odd bit line;
    removing the variable voltage is applied to the bit line connected to the specific cell to be programmed; and
    applying the selecting signal of the bit line having the high level voltage to the NMOS transistor of the bit line connected to the specific cell to be programmed so that data stored in the register transfers to the bit line.

7. The method according to claim 6, wherein the predetermined level is the sum of half the high level voltage and the threshold voltage of each NMOS transistor to which each discharge signal is applied.

8. The method according to claim 6, wherein the selecting signal of the bit line which is higher than a ground voltage and less than half the high level voltage is applied to the NMOS transistor of the bit line connected to the specific cell to be programmed for a certain period before applying the selecting signal of the bit line having the high level voltage.

9. The method according to claim 6, wherein applying the selecting signal of the bit line with the high level voltage further comprises:
    maintaining the bit line at the high level voltage by applying the selecting signal of the bit line with a low level voltage to the NMOS transistor of the bit line which is not connected to the specific cell to be programmed.

10. The method according to claim 6, wherein removing the variable voltage further comprises:
    applying a low level discharge signal to the NMOS transistor which is connected to each variable voltage input terminal and the specific bit line.

11. In a selecting unit of a non-volatile memory device comprising a first variable voltage input terminal applying a first variable voltage of a specific voltage level to an even bit line, a second variable voltage input terminal applying a second variable voltage of a specific voltage level to an odd bit line, a plurality of NMOS transistors connecting a specific bit line and each variable voltage input terminal in response to a discharge signal, and the plurality of the NMOS transistors connecting a detecting node and the specific bit line in response to a selecting signal of the bit line, a programming method comprising:

applying an even discharge signal and an odd discharge signal at a high level voltage, and simultaneously applying half of the high level voltage as the first variable voltage and the second variable voltage to apply half of the high level voltage to the even discharge signal and the odd discharge signal;

applying half of the high level voltage as the variable voltage to the bit line connected to a specific cell to be programmed, and applying the high level voltage as the variable voltage to the other bit line;

removing the variable voltage that is applied to the bit line connected to the specific cell to be programmed;

applying the selecting signal of the bit line at the high level voltage to the NMOS transistor of the bit line connected to the specific cell to be programmed so that data stored in the register transfers to the bit line.

12. The method according to claim 11, wherein the selecting signal of the bit line which is higher than a ground voltage and less than half of the high level voltage is applied to the NMOS transistor of the bit line connected to the specific cell to be programmed for a certain time period before applying the selecting signal of the bit line at the high level voltage.

13. The method according to claim 11, wherein applying the selecting signal of the bit line at the high level voltage further comprises:

maintaining the bit line at the high level voltage by applying the selecting signal of the bit line at a low level voltage to the NMOS transistor of the bit line which is not connected to the specific cell to be programmed.

14. The method according to claim 11, wherein removing the control signal comprises:

applying the low level discharge signal to the NMOS transistor which is connected to each variable voltage input terminal and the specific bit line.

* * * * *